United States Patent [19]

Bright et al.

[11] Patent Number: 4,716,494
[45] Date of Patent: Dec. 29, 1987

[54] RETENTION SYSTEM FOR REMOVABLE HEAT SINK

[75] Inventors: Edward J. Bright, Elizabethtown; David B. Sinisi, Harrisburg, both of Pa.

[73] Assignee: AMP Incorporated, Harrisburg, Pa.

[21] Appl. No.: 928,239

[22] Filed: Nov. 7, 1986

[51] Int. Cl.$^4$ ............................................. H05K 7/20
[52] U.S. Cl. .................................. 361/386; 165/80.3; 174/16 HS; 248/505; 267/160
[58] Field of Search ............... 361/382, 383, 386–388, 361/400, 403; 165/80.2, 80.3, 185; 357/79, 81; 174/16 HS; 248/505, 510, 316.7, 27.3; 24/457; 267/150, 160

[56] References Cited

U.S. PATENT DOCUMENTS

| 3,495,131 | 2/1970 | Melcher | 361/386 |
| 4,004,195 | 1/1977 | Harayda | 361/388 |
| 4,215,361 | 7/1980 | McCarthy | 165/80.3 |
| 4,345,267 | 8/1982 | Corman et al. | |
| 4,509,839 | 4/1985 | Lavochkin | 357/79 |
| 4,587,595 | 5/1986 | Staples | |
| 4,607,685 | 8/1986 | Mitchell, Jr. | |
| 4,660,123 | 4/1987 | Hermann | 361/386 |

OTHER PUBLICATIONS

AMP Data Sheet 78-511 "Chip Carrier Sockets-Low Height" AMP Incorporated, Harrisburg, Pa.
Semiconductor Accessories, publication No. 84-HS-3, p. 12, "Integrated Circuit Heat Sinks", Thermalloy Inc., Dallas, Tex.

Primary Examiner—G. P. Tolin
Attorney, Agent, or Firm—Anton P. Ness

[57] ABSTRACT

A heat sink (60) having one or more cooling fins (64) along a central shaft (66) is securable to an active device substrate (12) by a spring clip (80) whose latch sections (92) are latched under latch projections (44) on side walls (40) of the housing (30) to which the substrate (12) is mounted. The bow-shaped formed wire spring clip (80) has arcuate inner sections (82) disposed against the central shaft (66) of the heat sink (60) and exerts spring force downwardly on a retention fin (68) of the heat sink (60) when latched to the housing (30), which holds the bottom surface (62) of the heat sink (60) against the top substrate surface (22) to create a thermal connection.

14 Claims, 6 Drawing Figures

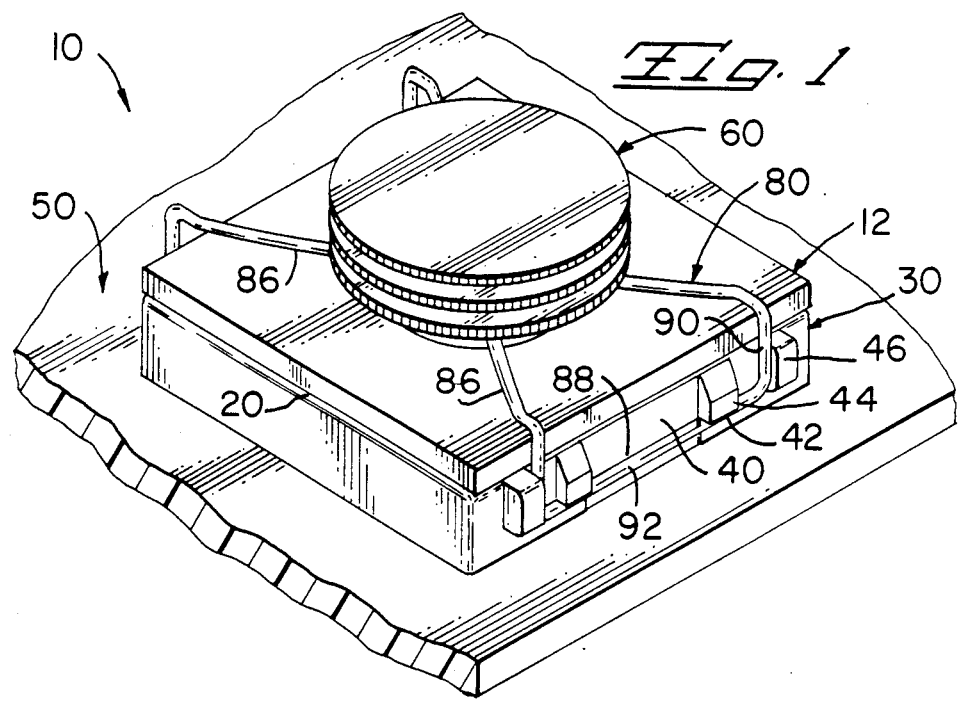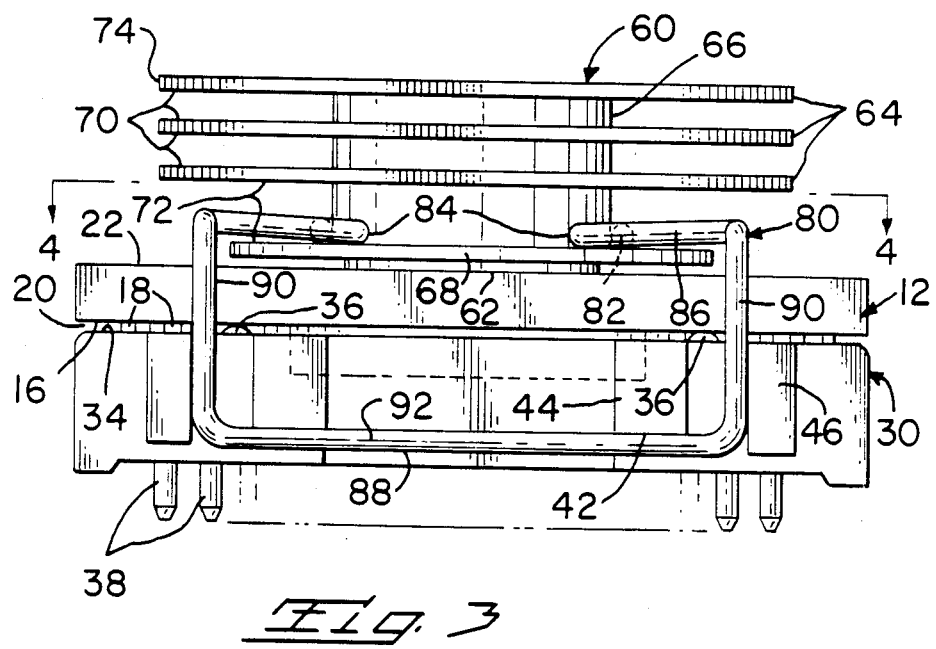

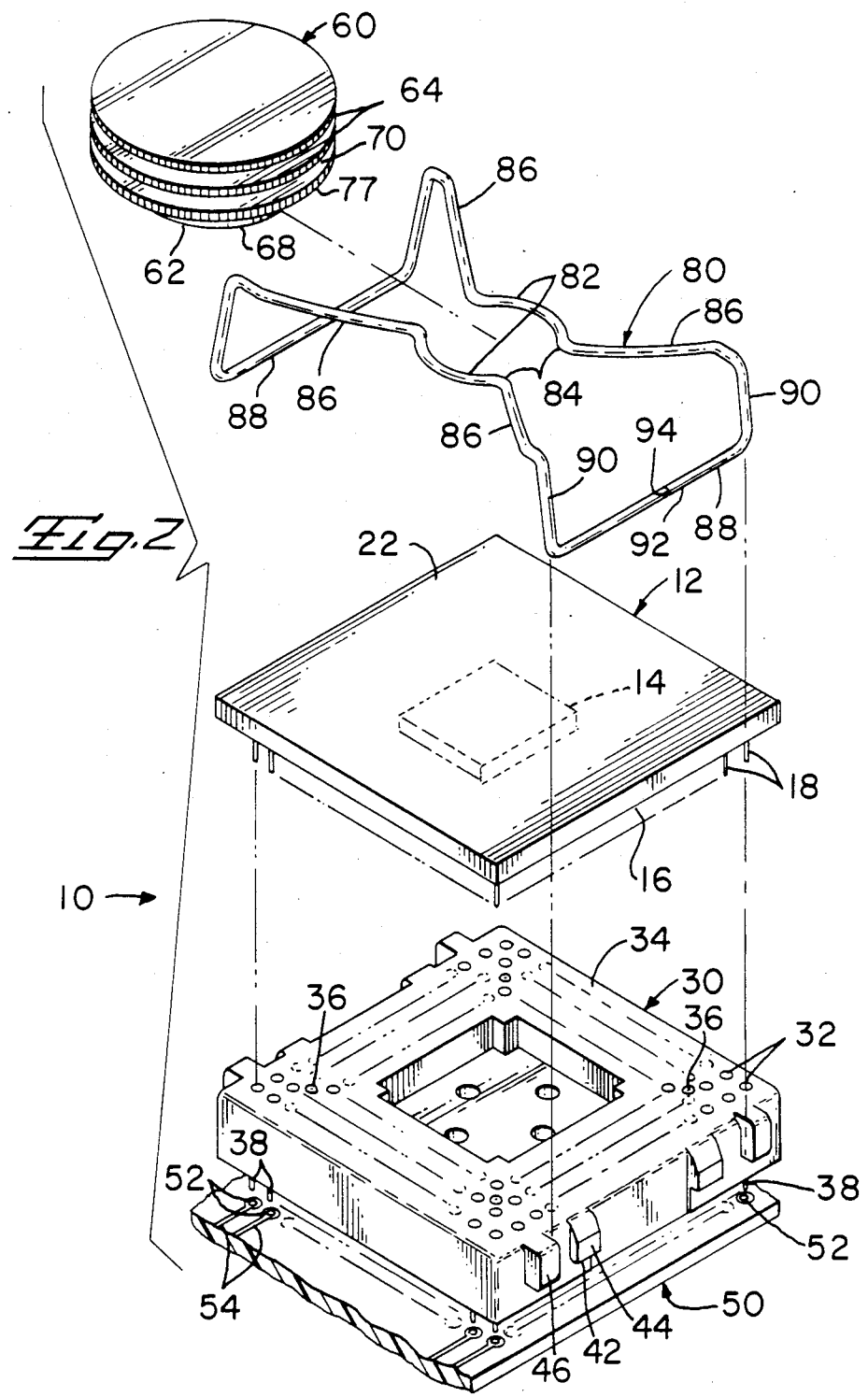

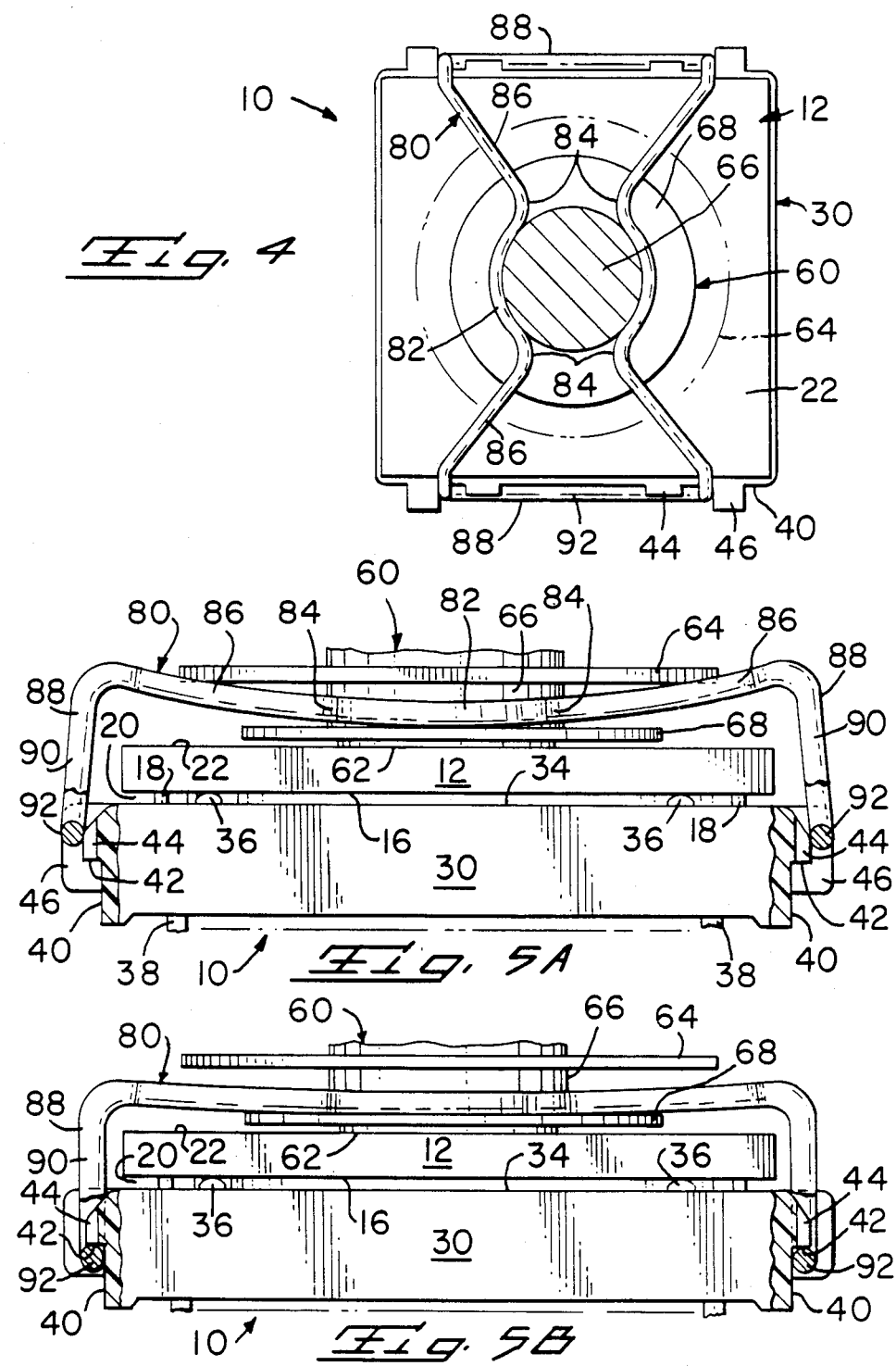

4,716,494

RETENTION SYSTEM FOR REMOVABLE HEAT SINK

FIELD OF THE INVENTION

The present invention relates to electrical connectors and more particularly to heat sinks for integrated circuit packages.

BACKGROUND OF THE INVENTION

Heat sinks for active device substrates such as chip carrier packages are necessary to dissipate heat generated from in-service functioning of the integrated circuitry, which heat could otherwise ruin the active element or chip. Two types of heat sinks with their particular securing means are disclosed in U.S. Pat. Nos. 4,345,276 and 4,587,595. Some heat sinks are known which are adapted to be assembled to a thermally conductive leadless chip-carrying ceramic substrate by a snap-on stamped and formed precisely shaped steel cover which also must hold the substrate within a chip carrier socket by substantial spring force such as about fifteen pounds for a 68-pin contact carrier. One such heat sink and cover assembly for leadless ceramic substrates and housings is sold by AMP Incorporated under Part No. 55358-3. Such a low-profile heat sink is machined aluminum and has three spaced transverse disk-like cooling fins about a short central shaft so that air flow may be forced between the fins which present substantial surface area to the air flow to dissipate heat, which is transmitted to the fins from the central shaft held in firm physical engagement with the substrate. The heat sink is secured to the steel cover holding the substrate in the housing, by opposing plate-like projections from the bottom of the central shaft being trapped under opposing spaced substrate-engaging straps of the cover between rounded bosses thereof when the heat sink is appropriately placed between the straps against the substrate at an angular 45° offset and then rotated. In such a heat sink, the cooling fins are made by parallel blade cuts of a first process step using conventional screw machine apparatus, while the projections must be made by a separate different process step involving prior removal from the screw machine apparatus. It would be desirable to provide an integral heat sink securable to a substrate by retention structures formed by a screw machine apparatus in the same process step as that wherein the cooling fins are formed by parallel blade cuts.

Where a connector needing a heat sink does not require a strong precisely shaped spring clip to secure the chip carrier to the connector, it would be desirable to provide a spring clip of reduced manufacturing expense, requiring reduced spring strength and less intricate shaping.

SUMMARY OF THE INVENTION

The heat sink of the present invention includes one or more cooling fins extending radially from a central shaft, and a retention disk of smaller diameter extending radially from the base of the shaft. An integral formed wire spring clip has opposed outer arms which will snap over latch projections along opposite outer side walls of the molded dielectric connector housing, and has opposed outwardly arcuate inner sections extending between the outer arms and will be disposed adjacent the top surface of the chip carrier. The central shaft of the heat sink is first snapped into position between the opposed arcuate inner sections of the spring clip from either side thereof past constrictions formed by outwardly bent ends of the arcuate inner sections, with the retention disk below the arcuate inner sections. Then upon latching of the spring clip-heat sink assembly to the chip carrier-connector housing assembly, the heat sink is held against the top surface of the chip carrier by the spring force such as five pounds exerted downwardly by the arcuate inner sectins joined to the now-latched outer arms. Thus, the bottom surface of the central shaft of the heat sink is held against the top surface of the chip carrier, and thermal grease may be used to enhance the thermal connection therebetween. The heat sink-spring clip assembly is easily removable by prying an outer arm outwardly to unlatch the spring clip.

It is an objective of the present invention to provide a heat sink whose cooling fins and retention fins are all formed in a single process step.

It is another objective to provide a spring clip for a heat sink of inexpensive manufacture, which both holds the heat sink to itself by spring force and holds the heat sink by spring force against an active device substrate by cooperating with latch features molded onto a connector housing assembled to the substrate.

BRIEF DESCRIPTION OF THE DRAWINGS

FIG. 1 is a chip carrier connector assembly containing the present invention and mounted on a circuit panel.

FIG. 2 is a perspective view of the heat sink and spring clip exploded from the chip carrier, connector housing and circuit panel of FIG. 1.

FIG. 3 is an elevation view of the assembly of FIG. 1.

FIG. 4 is a plan view taken along lines 4—4 of FIG. 3.

FIGS. 5A and 5B are diagrammatic elevation views of the latching sequence of the present invention.

DETAILED DESCRIPTION OF THE PREFERRED EMBODIMENT

In FIGS. 1 and 2 is illustrated an assembly 10 comprising a chip carrier 12, a connector housing 30, a circuit panel 50, a heat sink 60 and a spring clip 80. Chip carrier package 12 contains an active device such as integrated circuit chip 14 secured in a recess in the bottom or mating surface 16 and shown in phantom whose circuits are electrically and mechanically joined to leads having pin contact sections 18 in a pin grid array. Pin contact sections 18 are inserted into a corresponding array of socket-like spring contacts 32 of connector housing 30 when mating face 16 of chip carrier 12 is disposed on top or mating face 34 of housing 30. A small gap 20 is preferred between mating face 16 and mating face 34 created by rounded bosses 36 (FIG. 3), which allows receipt of a prying tool (not shown) therebetween for disassembly. Contacts 32 have leg sections 38 in an array insertable into a corresponding array of holes of a printed circuit panel 50, such as plated through-holes 52 comprising socket contact means, to which the chip carrier connector assembly 10 is to be mounted for in-service use, and electrically joined to circuit paths 54 of panel 50. Top substrate surface 22 of chip carrier package 12 is substantially planar to receive bottom surface 62 of heat sink 60 thereagainst under spring force to create a thermal connection.

Heat sink 60 has one or more cooling fins 64 extending radially, disk-like, from central shaft 66 as shown in FIGS. 2 and 3. Extending radially outwardly from proximate bottom surface 62 of central shaft 66 is retention fin 68 preferably of lesser diameter than cooling fins 64. Gaps 70 between cooling fins 64 permit forced air current over the substantial surface area of the fins, thus cooling chip carrier package 12 during in-service use, while gap 72 above retention fin 68 provides for heat sink retention as well as additional cooling capability. Knurled edges 74 facilitate handling.

Spring clip 80 can be an integral formed wire such as of stainless steel and having generally a bow-tie configuration. Referring to FIGS. 2 to 4, opposed outwardly arcuate inner spring sections 82 are shaped to conform to the curvature of central shaft 66 of heat sink 60, and are spaced apart to be disposed against central shaft 66 within gap 72 above retention fin 68. Heat sink 60 is snapped into place from laterally thereof, past opposing reversed bends 84 paired at the ends of inner spring sections 82 defining constrictions comprising heat sink latching members, with inner spring sections 82 preferably exerting spring force against central shaft 66. Intermediate sections 86 extend outwardly in related pairs from paired bends 84 of arcuate inner spring sections 82, and preferably diverge and angle slightly upwardly or is slightly concave facing upwardly. Opposed vertical outer sections 88 have depending portions 90 which extend downwardly from the outer ends of paired intermediate sections 86 to extend downwardly along side walls 40 of connector housing 30 and the associated side edges of chip carrier 12.

Each outer section 88 further includes a horizontal portion 92 joined to its depending portions 90, comprising a latch section 92 to latch under latch surfaces 42 of latching projections 44 along a corresponding side wall 40 (see FIG. 1). A pair of projections 46 at ends of side walls 40 near the top edges thereof, act to center outer sections 88 of spring clip 80 as it is placed onto housing 30. Latching projections 44 preferably are tapered downwardly and outwardly to facilitate latch sections 92 riding thereover during assembly. One latch section 92 may be placed under its latch surfaces 42 after which the other latch section 92 is pushed down over its latching projections 44 until latched. Ends of the wire from which spring clip 80 is formed are preferably welded together, such as at weld 94 along one of the horizontal latch sections 92.

Referring o FIGS. 5A and 5B, as horizontal portion 92 at each side wall 40 is urged downwardly over latching projection 44 and latches thereunder, spring force is generated on heat sink 30 transmitted by intermediate sections 86. Before latching, spring clip 80 is formed so that with arcuate inner spring sections 82 against retention fin 68 and bottom surface 62 of heat sink 60 against top substrate surface 22, upwardly angled intermediate sections 86 elevate horizontal latch sections 92 to a location slightly higher than latch surfaces 42. After latching, intermediate sections 86 are deflected downwardly urging arcuate inner sections 82 against retention fin 68, generating a downward spring force on heat sink 60 such as for example of five pounds, assuring a thermal connection which is preferably enhanced by conventional thermal gel. Removal of heat sink-spring clip assembly 30,80 is easily accomplished using a simple prying tool (not shown) inserted behind a latch section 92 of spring clip 80, between latching projections 44 of housing 30.

Heat sink 60 can be conventionally made in a screw machine apparatus (not shown) from cylindrical aluminum bar stock, with parallel cuts of one or more saw blades creating gaps 70,72. While the heat sink is still secured in the apparatus, tooling is known which can be secured therein to reduce the diameter of retention fin 68, if such is desired. The operations forming the planar top and bottom heat sink surfaces and the knurling are conventional.

Variations may occur to the skilled artisan which are within the spirit of the invention and the scope of the claims.

What is claimed is:

1. A retention system for securing a heat sink to an active device-containing means including a thermally conductive substrate having a substantially planar top surface and opposing side edges and further including a housing means having sidewalls, said system comprising:

a heat sink including a substrate-proximate surface engageable with the substrate upon assembly to said active device containing means to form a thermal connection, and further including a central shaft extending upwardly from said substrate-proximate surface and a retention fin extending radially outwardly from said central shaft proximate said substrate-proximate surface;

an integral formed wire spring clip having opposing horizontal inner sections arcuately shaped to conform to said central shaft and spaced apart to engage and hold said central shaft therebetween when said heat sink is inserted therebetween with said retention fin thereunder, said arcuate inner sections each having a reversed bend at each end thereof which bends are in opposed pairs from which intermediate sections extend outwardly in related pairs and are angled slightly upwardly, and outer sections joining outer ends of each said pair of intermediate sections and each having portions depending from said outer ends joined by a horizontal latch member integral with said depending portions and disposed a selected distance lower than said arcuate inner sections, each said outer section cooperating with a respective opposing side wall of the housing means of the active device-containing means, said outer sections being spaced apart to be received along the opposing substrate side edges and the opposing side walls of the housing means; and latching projections disposed on the respective opposing side walls of the housing means having downwardly facing latch surfaces latchingly engageable by respective said horizontal latch members upon assembly of said spring clip to the housing means, said latch surfaces located at a selected distance lower than the top surface of the substrate engageable by said heat sink, such that upon assembly when said heat sink engages the top substrate surface, said intermediate sections are resiliently deflected downwardly for said horizontal latch members to latch under said latch surfaces, thus generating downward spring force on said heat sink retention fin and creating an assured thermal connection between the top substrate surface and said substrate-proximate surface of said heat sink.

2. A retention system as set forth in claim 1 wherien said latching projections have outer surfaces tapered outwardly proceeding downwardly to said latch surfaces.

3. A retention system as set forth in claim 1 wherein said heat sink includes at least one cooling fin extending radially outwardly from said central shaft thereof spaced above said retention fin.

4. A retention system as set forth in claim 1 wherein said retention fin is annular.

5. A retention system as set forth in claim 1 wherein said spring clip is stainless steel.

6. A retention system as set forth in claim 1 wherein the ends of the wire from which said spring clip is made are welded together.

7. A retention system as set forth in claim 1 wherein said arcuate inner sections exert spring force against said heat sink central shaft upon assembly.

8. A retention system as set forth in claim 1 wherein said intermediate sections diverge and said depending portions are spaced apart, whereby said spring clip is adapted to receive said central shaft and said retention fin of said heat sink insertably therebetween from laterally thereof during assembly.

9. An electrical connector assembly for an active device, comprising:
 active device-containing means including housing means having upper and lower sides and opposing side walls, an active device contained within said housing means, and a plurality of contact means electrically connected to said active device and having respective contact sections exposed along said lower side of said housing means for electrical connection with other contact means, said active device-containing means including a thermally conductive substrate along said upper side over said active device and having a substantially planar top surface and opposing side edges;
 a heat sink including a substrate-proximate surface engaged with said top surface of said substrate to form a thermal connection, and further including a central shaft extending upwardly from said substrate-proximate surface and a retention fin extending radially outwardly from said central shaft proximate said substrate-proximate surface;
 an integral formed wire spring clip having opposing horizontal inner sections arcuately shaped to conform to said central shaft and spaced apart, engaging and holding said central shaft therebetween with said retention fin thereunder, said arcuate inner sections each having a reversed bend at each end thereof which bends are in opposed pairs from which intermediate sections extend outwardly in related pairs and are angled slightly upwardly, and outer sections joining outer ends of each said pair of intermediate sections and each having portions depending from said outer ends joined by a horizontal latch member integral with said depending portions and disposed a selected distance lower than said arcuate inner sections, each said outer section cooperating with a respective said opposing side wall of said housing means, said outer sections being spaced apart to be received along said opposing substrate side edges and said opposing housing side walls; and
 latching projections disposed on said respective opposing side walls of said housing means having downwardly facing latch surfaces latchingly engaged by respective said horizontal latch members, said latch surfaces located at a selected distance lower than said top surface of said substrate engaged by said heat sink, such that upon assembly when said heat sink engages said top substrate surface, said intermediate sections are resiliently deflected downwardly for said horizontal latch members to latch under said latch surfaces, thus generating downward spring force on said heat sink retention fin and creating a thermal connection between said top substrate surface and said substrate-proximate surface of said heat sink.

10. An electrical connector assembly as set forth in claim 9 wherein said active device-containing means further comprises an active device package including said substrate and said active device and mounted to the top of said housing means.

11. An electrical connector assembly as set forth in claim 10 wherein said active device package is leaded having an array of pin contact sections extending from the bottom thereof, and said housing means is a connector having a like array of contact sections across the top thereof mating with said pin contact sections of said active device package.

12. An electrical connector assembly as set forth in claim 11 wherein said connector includes an array of pin contact sections extending therebelow insertable into a like array of socket contact means of a circuit panel.

13. An electrical connector assembly as set forth in claim 9 wherein said housing side walls further include means for centering said outer spring clip sections.

14. A retention clip for retaining a heat sink on an active device-containing means in thermal connection with a top surface of a thermally conductive substrate thereof for dissipating heat, the active device-containing means having a housing means including opposing side walls having latch means thereon, and the heat sink including a retention fin extending radially outwardly from a central shaft proximate a substrate-proximate surface of the heat sink, the retention clip comprising:
 an integral formed wire spring member having opposing horizontal inner sections arcuately shaped to conform to the central shaft of the heat sink above the retention fin, said inner sections spaced apart to engage and hold the central shaft therebetween, said arcuate inner sections each having a reversed bend at each end thereof which bends are in opposed pairs from which intermediate sections extend outwardly in related pairs and are angled slightly upwardly, said intermediate sections diverging to receive the central shaft insertably therebetween from laterally thereof during assembly, said spring member further having outer sections joining outer ends of each said pair of intermediate sections and each having portions depending from said outer ends joined by a horizontal member integral with said depending portions and disposed a selected distance lower than said arcuate inner sections, said depending portions of each said outer section being spaced apart to receive the retention fin of the heat sink insertable therebetween from laterally thereof during assembly, each said outer section associated with a respective opposing side wall of the housing means, said outer sections being spaced apart to be received along the opposing side walls of the housing means during assembly such that said horizontal members are latchingly engageable by the latch means of the respective opposing side walls of the housing mean, said depending portions having a length relative to the latch means such that said intermediate sections are deflected downwardly for said horizontal members to be latchingly engaged by the latch means, thus generating downward spring force on the heat sink retention fin and holding the substrate-proximate surface of the heat sink under spring force against the top substrate surface creating an assured thermal connection therebetween.

* * * * *